(12) United States Patent
Taira et al.

(10) Patent No.: US 12,059,664 B2
(45) Date of Patent: Aug. 13, 2024

(54) METHOD OF PRODUCING SUBSTANCE (71) Applicant: INTER-UNIVERSITY RESEARCH INSTITUTE CORPORATION NATIONAL INSTITUTES OF NATURAL SCIENCES, Mitaka (JP)

(72) Inventors: Takunori Taira, Okazaki (JP); Arvydas Kausas, Okazaki (JP)

(73) Assignee: INTER-UNIVERSITY RESEARCH INSTITUTE CORPORATION NATIONAL INSTITUTES OF NATURAL SCIENCES, Mitaka (JP)

( * ) Notice: Subject to any disclaimer, the term of this patent is extended or adjusted under 35 U.S.C. 154(b) by 865 days.

(21) Appl. No.: 17/055,170

(22) PCT Filed: May 14, 2019

(86) PCT No.: PCT/JP2019/019179
§ 371 (c)(1),
(2) Date: Nov. 13, 2020

(87) PCT Pub. No.: WO2019/221147
PCT Pub. Date: Nov. 21, 2019

(65) Prior Publication Data
US 2021/0221692 A1   Jul. 22, 2021

(30) Foreign Application Priority Data
May 17, 2018   (JP) .................................. 2018-095608

(51) Int. Cl.
*B23K 26/57*   (2014.01)
*B01J 19/12*   (2006.01)
(Continued)

(52) U.S. Cl.
CPC ............. *B01J 19/121* (2013.01); *B01J 19/12* (2013.01); *B23K 26/356* (2015.10); *B23K 26/57* (2015.10); *C01B 32/28* (2017.08); *C30B 33/04* (2013.01)

(58) Field of Classification Search
CPC ........ B23K 26/57; B23K 26/356; B01J 19/12; B01J 19/121; B01J 2219/0879; C30B 1/08; C30B 33/04; C30B 29/22; C01B 32/28
See application file for complete search history.

(56) References Cited

U.S. PATENT DOCUMENTS 3,585,088 A    6/1971   Schwuttke et al.
5,690,794 A *  11/1997  Molchanov ............ B01J 19/121
                                                   204/157.4
(Continued)

FOREIGN PATENT DOCUMENTS

JP   S49-047630 B1   12/1974
JP   2011-159696 A    8/2011
(Continued)

OTHER PUBLICATIONS

Ohfuji, Hiroaki et al., "Natural occurrence of pure nano-polycrystalline diamond from impact crater," Scientific Reports vol. 5, 14702(2015), 10.1038/srep14702.
(Continued)

*Primary Examiner* — Monica A Huson
(74) *Attorney, Agent, or Firm* — Faegre Drinker Biddle Reath LLP (57) ABSTRACT

A method of producing a substance includes a producing step of producing a new substance by, in a state in which a raw material absorbing giant pulse laser light is disposed inside a base material or in a state in which the base material and the raw material are brought into contact with each other and are clamped together, performing irradiation with the
(Continued)

giant pulse laser light such that the raw material absorbs the giant pulse laser light and thereby generating shock waves such that at least the raw material undergoes phase transition.

6 Claims, 5 Drawing Sheets

(51) Int. Cl.
*B23K 26/356* (2014.01)
*C01B 32/28* (2017.01)
*C30B 33/04* (2006.01)

(56) References Cited

U.S. PATENT DOCUMENTS 6,203,865 B1 3/2001 Badzian et al.
2011/0210479 A1 9/2011 Yang et al.

FOREIGN PATENT DOCUMENTS

| JP | 2015-506887 A | 3/2015 |
| JP | 2018-001068 A | 1/2018 |
| WO | WO-2013/001527 A1 | 1/2013 |

OTHER PUBLICATIONS

International Preliminary Report on Patentability mailed Nov. 26, 2020 for PCT/JP2019/019179.

* cited by examiner

Fig. 1

METHOD OF PRODUCING SUBSTANCE

TECHNICAL FIELD

An aspect of the present invention relates to a method of producing a substance.

BACKGROUND ART

In the related art, regarding a technology related to a method of producing a substance, for example, a method of producing a diamond disclosed in Non-Patent Literature 1 is known. In the method of producing a diamond disclosed in Non-Patent Literature 1, when a carbonate mineral and a silicate mineral are pressurized and are placed in a high-temperature state, these trigger a reaction, and a diamond is produced.

CITATION LIST

Non-Patent Literature

[Non-Patent Literature 1] H. Ohfuji, et. Al., □Scientific Reports volume 5□, Article number: 14702 (2015), doi: 10.1038/srep 14702

SUMMARY OF INVENTION

Technical Problem

In the foregoing technology in the related art, when a new substance is produced, a large-size apparatus is required. Recently, there has been a demand for a method of producing a substance, in which a new substance can be produced easily.

An aspect of the present invention has been made in consideration of the foregoing circumstances, and an object thereof is to provide a method of producing a substance, in which a new substance can be produced easily.

Solution to Problem

According to an aspect of the present invention, there is provided a method of producing a substance including a producing step of producing a new substance by, in a state in which a raw material absorbing giant pulse laser light is disposed inside a base material or in a state in which the base material and the raw material are brought into contact with each other and are clamped together, performing irradiation with the giant pulse laser light such that the raw material absorbs the giant pulse laser light and thereby generating shock waves such that at least the raw material undergoes phase transition.

In this method of producing a substance, a substance can be newly created by performing irradiation with the giant pulse laser light and performing phase transition using generated shock waves. That is, a substance can be newly created utilizing giant pulse laser light which can be expected in a compact and simple configuration. Thus, a new substance can be produced easily.

In the method of producing a substance according to the aspect of the present invention, the base material may be formed of a transparent material transparent with respect to the giant pulse laser light. The raw material may be a defect disposed inside the transparent material. In the producing step, the substance as the transparent material may be produced by performing irradiation with the giant pulse laser light such that the defect absorbs the giant pulse laser light and thereby generating shock waves such that the defect undergoes phase transition and recrystallization. In this case, the base material can be repaired by causing the defect to undergo phase transition.

In the method of producing a substance according to the aspect of the present invention, the base material and the raw material may have a thin film shape. In the producing step, a laminate may be formed by alternately laminating the base material and the raw material, the laminate may be clamped in a lamination direction thereof, and the substance transparent with respect to the giant pulse laser light may be produced by performing irradiation with the giant pulse laser light such that the raw material absorbs the giant pulse laser light and thereby generating shock waves such that the raw material and the base material undergo phase transition. In this manner, according to the present invention, a new transparent substance can be produced by causing the raw material to undergo phase transition together with the base material in the laminate which is a multilayer film.

In the method of producing a substance according to the aspect of the present invention, in the producing step, the substance transparent with respect to the giant pulse laser light may be produced by performing scanning with the giant pulse laser light and thereby causing the raw material and the base material in a predetermined region in the laminate to undergo phase transition. In this case, a substance can be produced in the entire predetermined region by causing the entire predetermined region in the laminate to undergo phase transition.

In the method of producing a substance according to the aspect of the present invention, the raw material may be fine particles disposed in a dispersed manner inside the base material. In the producing step, the substance transparent with respect to the giant pulse laser light may be produced by performing irradiation with the giant pulse laser light such that the fine particles absorb the giant pulse laser light and thereby generating shock waves such that the fine particles and the base material undergo phase transition. In this manner, according to the present invention, a new transparent substance can be produced by causing a plurality of fine particles to undergo phase transition together with the base material in the base material into which the fine particles are incorporated.

In the method of producing a substance according to the aspect of the present invention, in the producing step, the substance transparent with respect to the giant pulse laser light may be produced by performing scanning with the giant pulse laser light and thereby causing the fine particles and the base material to undergo phase transition in a predetermined region in the base material. In this case, a substance can be produced in the entire predetermined region by causing the entire predetermined region in the base material to undergo phase transition.

Advantageous Effects of Invention

According to the aspect of the present invention, it is possible to provide a method of producing a substance, in which a new substance can be produced easily.

DESCRIPTION OF EMBODIMENTS

Hereinafter, embodiments will be described in detail with reference to the drawings. In the following description, the same reference signs are applied to elements which are the same or corresponding, and duplicate description will be omitted.

First Embodiment

Figure 1:
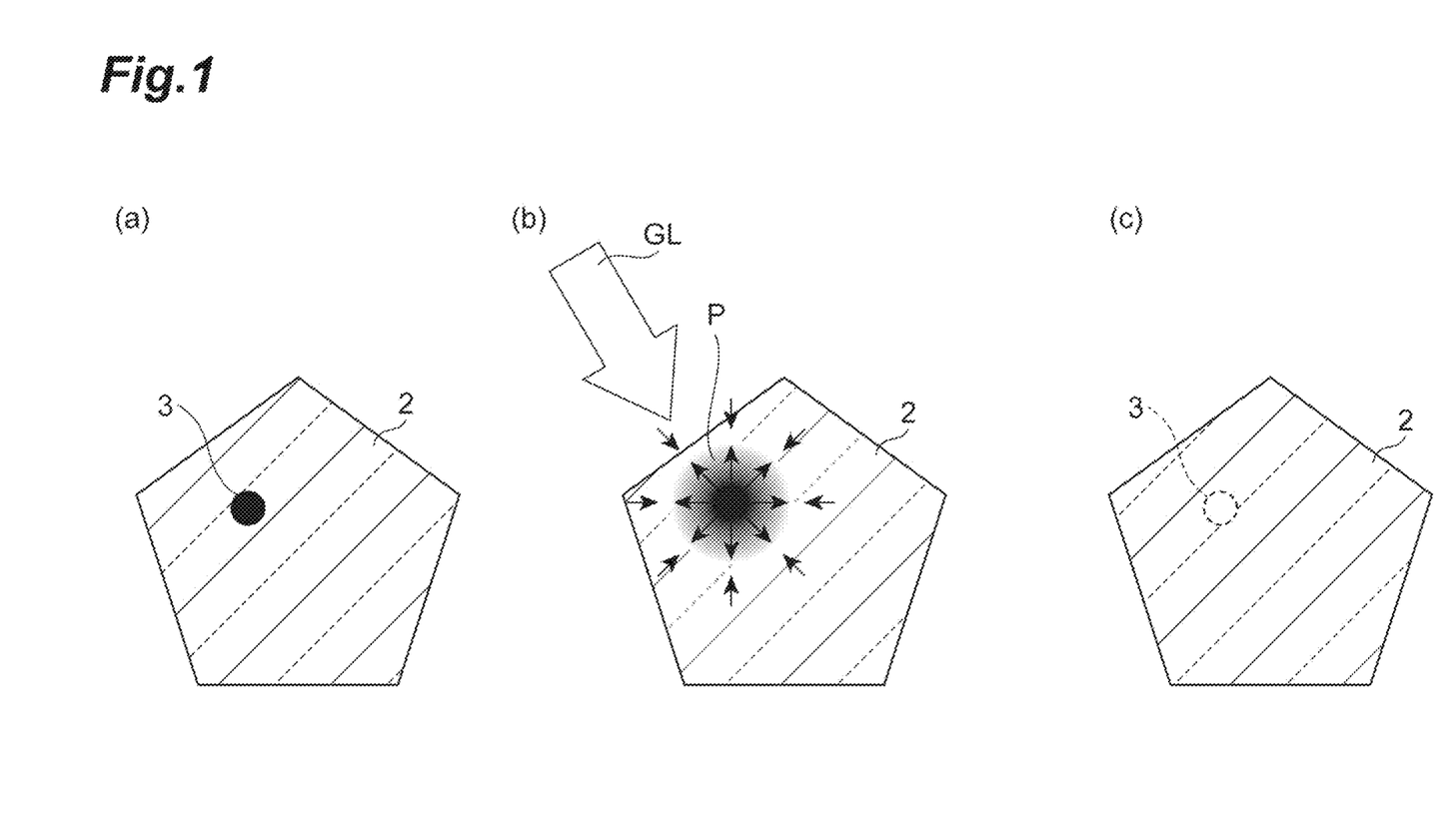
FIG. 1(a) is a schematic cross-sectional view illustrating a method of producing a substance according to a first embodiment.
FIG. 1(b) is a schematic cross-sectional view showing a step after FIG. 1(a).
FIG. 1(c) is a schematic cross-sectional view showing a step after FIG. 1(b).

A method of producing a substance according to a first embodiment is a method which can be applied to repair a defect inside a transparent material through recrystallization (phase transition) (that is, a method of repairing an internal defect). Particularly, the method of producing a substance shown in FIG. 1 is applied to repair a defect 3 inside a jewel 2.

The jewel 2 is a solid material or a mineral, for example, used in accessories or the like. The jewel 2 constitutes a base material. The jewel 2 may be an inorganic crystal which is a natural mineral and may be an artificial synthetic substance. The jewel 2 is formed of a transparent material which is transparent. The term transparent means that giant pulse laser light GL (which will be described below) is transmitted and specifically means that the giant pulse laser light GL passes through while an intensity thereof is maintained. For example, the term transparent denotes that a transmittance (a net transmittance obtained by subtracting a Fresnel loss) with respect to the giant pulse laser light GL is 95% or higher and specifically 97% or higher. The same applies to the term transparent below.

Examples of the jewel 2 include diamond, garnet, sapphire, ruby, lapis lazuli, opal, obsidian, moldavite, pearl, amber, and cubic zirconia. Here, the jewel 2 is formed of diamond. The defect 3 is a part which has not been able to be crystallized inside the jewel 2. For example, when the jewel 2 is diamond, the defect 3 is a carbonized dark part in the jewel 2. The defect 3 constitutes a raw material which is disposed inside the base material and absorbs the giant pulse laser light GL (which will be described below).

Figure 2:
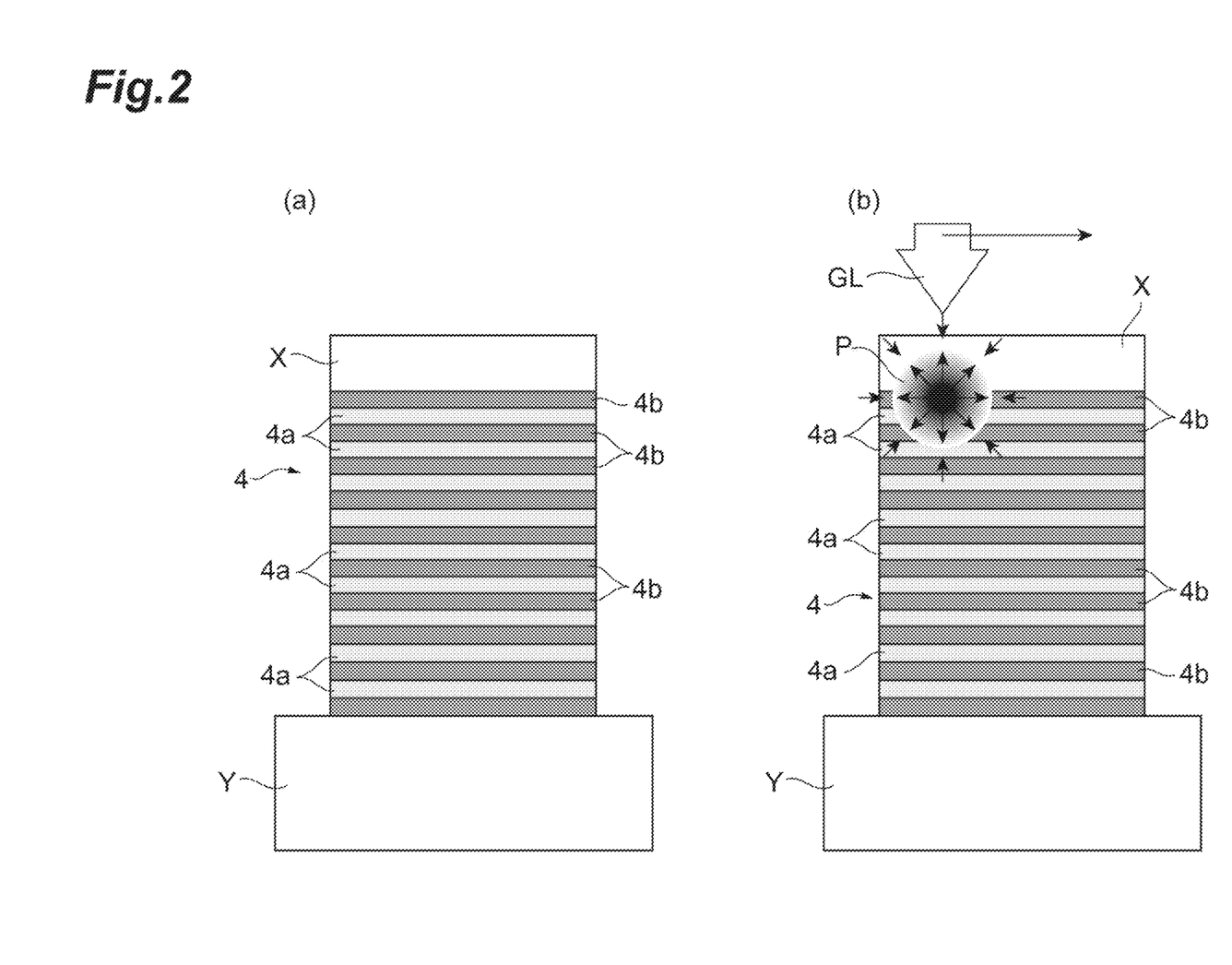
FIG. 2(a) is a schematic side view illustrating a method of producing a substance according to a second embodiment.
FIG. 2(b) is a schematic side view showing a step after FIG. 2(a).

As shown in FIG. 1(a), in the method of producing a substance according to the first embodiment, first, the jewel 2 having the defect 3 present therein is prepared. As shown in FIG. 2(b), shock waves P are generated by irradiating the jewel 2 with the giant pulse laser light GL and causing the defect 3 to absorb the giant pulse laser light GL. The shock waves P are forced back inside the jewel 2 so that a part including the defect 3 is brought into an extremely high temperature and high compression state. Accordingly, the defect 3 undergoes phase transition and recrystallization, and diamond forming the jewel 2 is produced as a new substance in a manner of repairing the defect 3. As a result, a dark region in which the defect 3 is present also becomes transparent.

The giant pulse laser light GL is laser light which can generate the shock waves P. The giant pulse laser light GL is laser light having a sub-nanosecond pulse width. The giant pulse laser light GL is obtained by utilizing a micro-laser and a system thereof. The giant pulse laser light GL is laser light having a peak power of several hundred kW or greater, for example. The giant pulse laser light GL is laser light of which a pulse width is within a range of 1 ps to 10 ns (particularly, a range of 10 ps to 1 ns), for example. As an example, the giant pulse laser light GL may have a pulse width of 0.6 ns and a wavelength of 1,064 nm, and be focused using a light focusing lens having a focal distance of 300 mm. As an example, the giant pulse laser light GL may have a laser intensity of 900 MW/cm$^2$, a beam diameter of 1.42 mm, a pulse energy of 5 mJ, a pulse width of 700 ps, and a wavelength of 1,064 nm.

Hence, in the method of producing a substance of the present embodiment, a substance can be newly created by performing irradiation with the giant pulse laser light GL which can be expected in a compact and simple configuration and performing phase transition due to the generated shock waves P. A new substance can be produced easily.

Particularly in the present embodiment, a substance as the transparent material is produced by performing irradiation with the giant pulse laser light GL such that the defect 3 disposed inside the jewel 2 (transparent material) absorbs the giant pulse laser light GL and thereby generating the shock waves P such that the defect 3 undergoes phase transition and recrystallization. In this case, the jewel 2 can be repaired by causing the defect 3 to undergo phase transition. A step of performing irradiation with the giant pulse laser light GL and causing the defect 3 to absorb the giant pulse laser light GL constitutes the producing step.

Second Embodiment

Next, a second embodiment will be described. In description of the second embodiment, points differing from the first embodiment will be described.

A method of producing a substance according to the second embodiment is a method which is used for manufacturing a chemical compound and in which a multilayer film undergoes phase transition and is made transparent. Particularly, in the method of producing a substance shown in FIGS. 2 and 3, the entire region (large region) in a laminate 4 constituted of a multilayer film is caused to undergo phase transition and is made transparent.

The laminate 4 includes a plurality of base materials 4a and a plurality of raw materials 4b. The base materials 4a and the raw materials 4b exhibit a thin film shape. The base materials 4a and the raw materials 4b are laminated alternately. The base materials 4a are formed of a transparent material which is transparent. Examples of the base materials 4a include diamond, silicon carbide, sapphire, and YAG. YAG includes YAG ($3Y_2O_3$-$5Al_2O_3$) to which a luminescence center is added. Similarly, regarding other media, the rare earth (RE) elements Nd or Yb or transition metals (TM) Ti or Cr are mainly used for the luminescence center, but a luminescence center may or may not be added depending on the purpose. The raw materials 4b are colored before phase transition and are formed of a material which can be made transparent together with the base materials 4a through phase transition. Examples of the raw materials 4b include silicon, aluminum, scandium, and carbon.

As shown in FIG. 2(a), in the method of producing a substance according to the second embodiment, first, the laminate 4 is formed by alternately laminating the base materials 4a and the raw materials 4b. The laminate 4 is sandwiched between substances X and Y in a lamination direction thereof. That is, the laminate 4 is firmly clamped in the lamination direction thereof and is fixed using the substances X and Y. The base materials 4a and the raw materials 4b are brought into contact with each other and are clamped. The substances X and Y are formed of a transparent material having a high degree of hardness. The substance X is Nd: YAG, for example. The substance Y is diamond, silicon carbide, or sapphire, for example. The substances X and Y are not particularly limited and may be formed of various materials.

Figure 3:
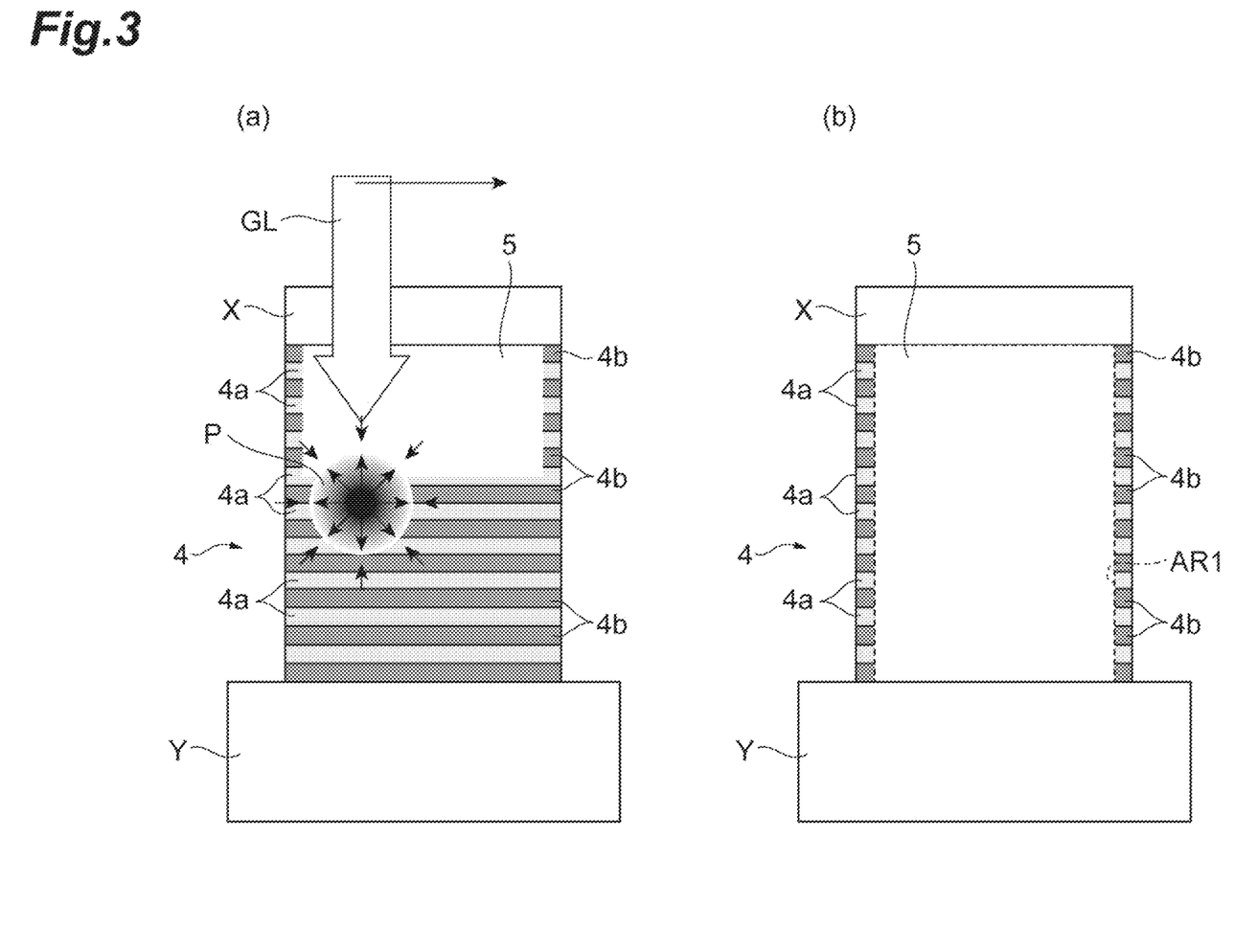
FIG. 3(a) is a schematic side view illustrating a step after FIG. 2(b).
FIG. 3(b) is a schematic side view illustrating a step after FIG. 3(a).
Figure 4:
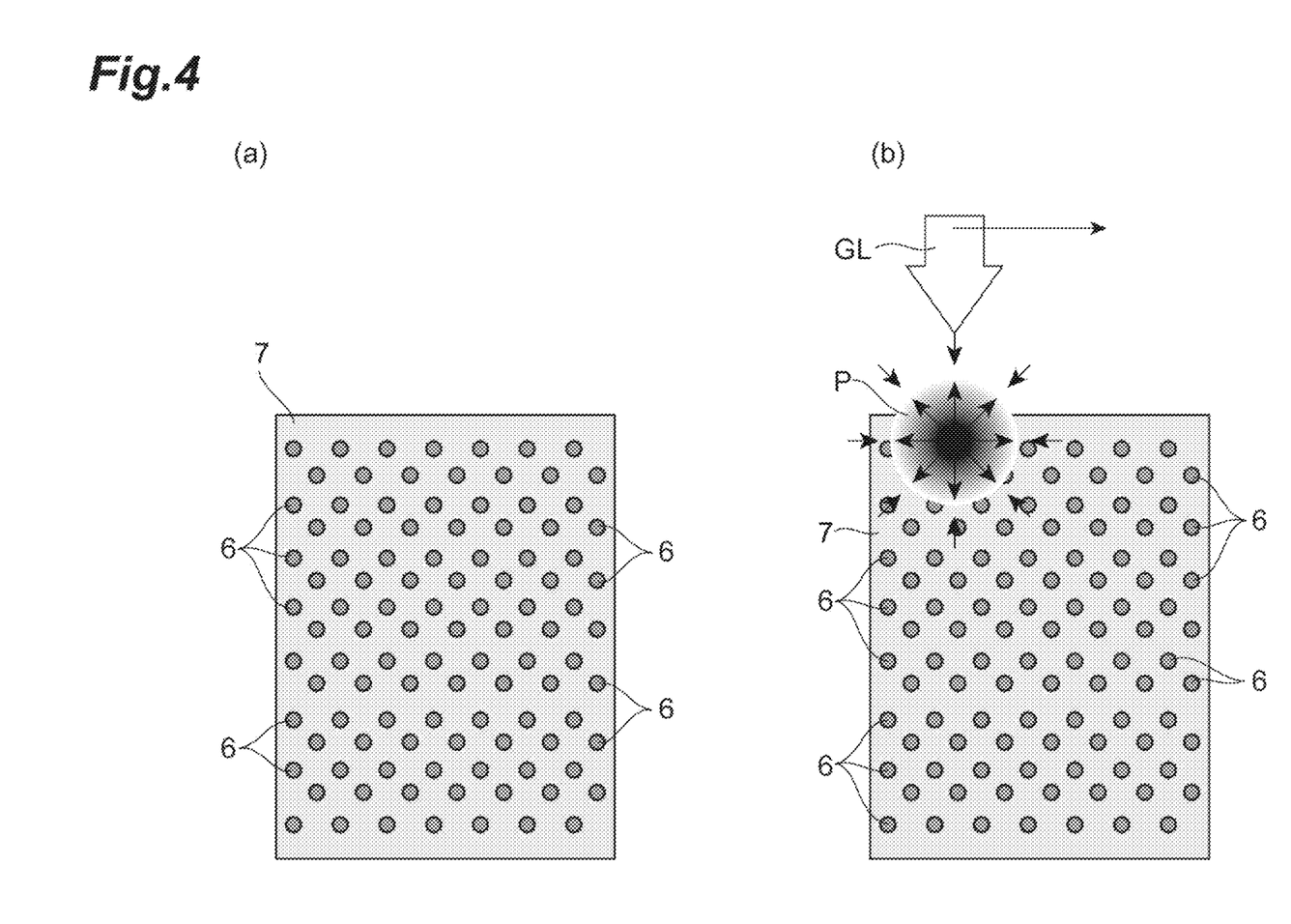
FIG. 4(a) is a schematic side view illustrating a method of producing a substance according to a third embodiment.
FIG. 4(b) is a schematic side view showing a step after FIG. 4(a).
Figure 5:
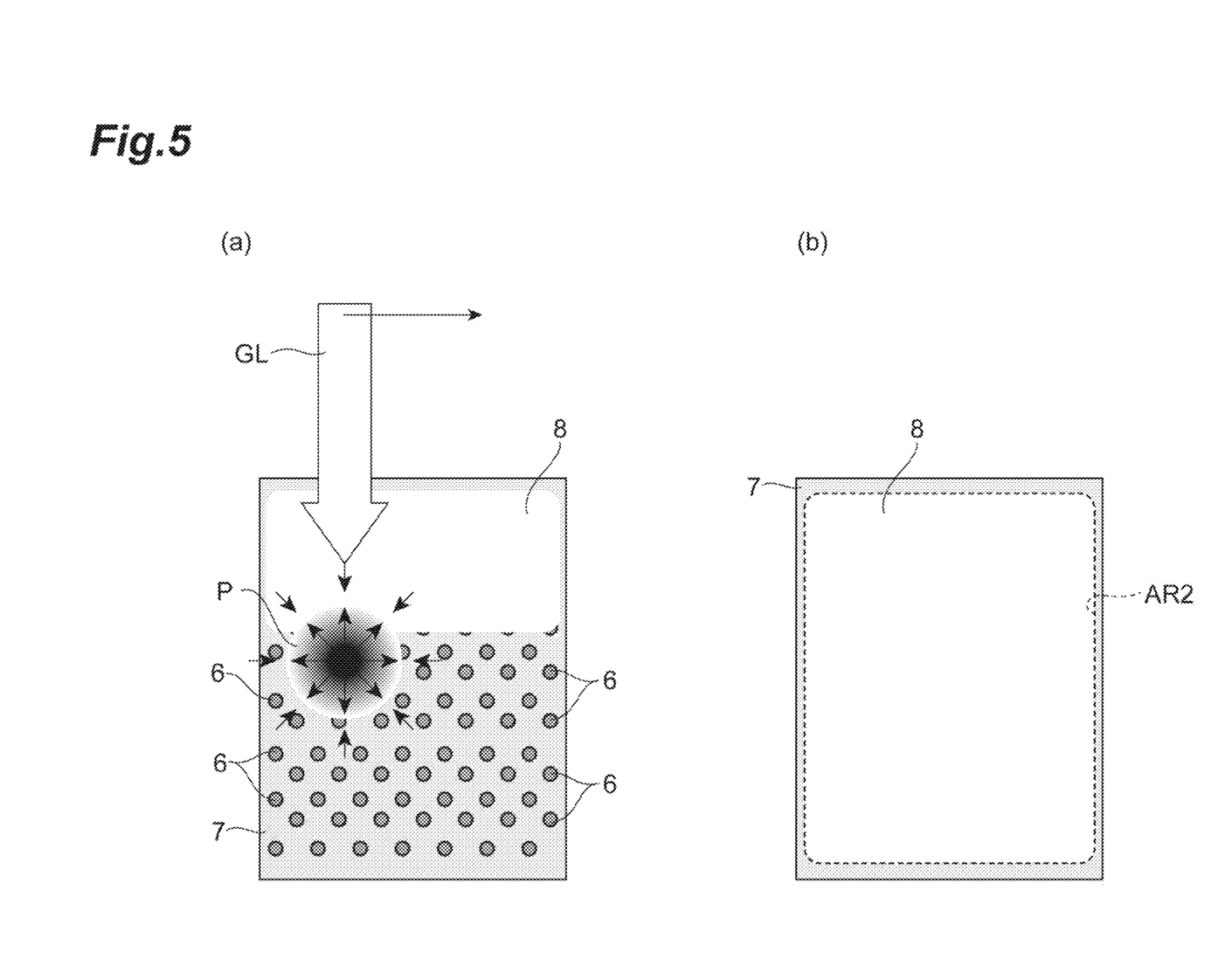
FIG. 5(a) is a schematic side view illustrating a step after FIG. 4(b).
FIG. 5(b) is a schematic side view illustrating a step after FIG. 5(a).

As shown in FIG. 2(b), the shock waves P are generated by irradiating the laminate 4 with the giant pulse laser light GL and causing the raw materials 4b to absorb the giant pulse laser light GL. The shock waves P are forced back inside the laminate 4 so that the raw materials 4b and the base materials 4a therearound are brought into an extremely high temperature and high compression state. Accordingly, the raw materials 4b undergo phase transition together with the base materials 4a, and a transparent chemical compound including at least any of the constituent elements of the base materials 4a and the raw materials 4b is produced as a new substance 5 (refer to FIG. 3).

Scanning is performed with the giant pulse laser light GL used for irradiation in a surface region perpendicular to an incident direction thereof, and the phase transition of the base materials 4a and the raw materials 4b progresses in the direction of scanning. As shown in FIG. 3(a), such scanning performed with the giant pulse laser light GL is repeated a plurality of times corresponding to the number of layers of the raw materials 4b included in the laminate 4, for example. Accordingly, phase transition of the raw materials 4b and the base materials 4a occurs sequentially from the side where the giant pulse laser light GL is incident in the laminate 4. As a result, as shown in FIG. 3(b), a predetermined region AR1 is reformed by causing the raw materials 4b and the base materials 4a to undergo phase transition in the predetermined region AR1 throughout the entire laminate 4, and a transparent substance 5 is produced in the predetermined region AR1.

Hence, in the method of producing a substance of the present embodiment as well, a new substance 5 can be produced easily.

Particularly, in the present embodiment, the laminate 4 is formed, the laminate 4 is clamped in the lamination direction thereof, and irradiation is performed with the giant pulse laser light GL such that the raw materials 4b absorb the giant pulse laser light GL. Accordingly, the transparent substance 5 is produced by generating the shock waves P and causing the base materials 4a and the raw materials 4b to undergo phase transition. In this manner, according to the present embodiment, a new transparent substance 5 can be produced by causing the raw materials 4b to undergo phase transition together with the base materials 4a in the laminate 4 (multilayer film).

In the present embodiment, the transparent substance 5 is produced by performing scanning with the giant pulse laser light GL and thereby causing the raw materials 4b to undergo phase transition together with the base materials 4a in the predetermined region AR1 in the laminate 4. In this case, the substance 5 can be produced in the entire predetermined region AR1 by causing the entire predetermined region AR1 in the laminate 4 to undergo phase transition.

A step of performing irradiation with the giant pulse laser light GL and causing the raw materials 4b to absorb the giant pulse laser light GL constitutes the producing step. In certain regions in the laminate 4, the combination of materials for the base materials 4a and the raw materials 4b (thin film shapes) may be suitably changed in accordance with the purpose.

Third Embodiment

Next, a third embodiment will be described. In description of the third embodiment, points differing from the first embodiment will be described.

A method of producing a substance according to the third embodiment is a method which is used for manufacturing a chemical compound and in which a base material having fine particles disposed in a dispersed manner is caused to undergo phase transition and is made transparent. Particularly, in the method of producing a substance shown in FIGS. 4 and 5, the entire region (large region) in a base material 7 including a number of fine particles 6 is caused to undergo phase transition and is made transparent.

The fine particles 6 are disposed inside the base material 7 in a dispersed manner. The fine particles 6 constitute a raw material for absorbing the giant pulse laser light GL. The fine particles 6 are colored before phase transition and are formed of a material which can be made transparent together with the base material 7 through phase transition. Examples of the fine particles 6 include silicon, aluminum, scandium, and carbon. The base material 7 is formed of a transparent material which is transparent. Examples of the base material 7 include diamond, silicon carbide, sapphire, and YAG.

As shown in FIG. 4(a), in the method of producing a substance according to the third embodiment, first, the base material 7 having the fine particles 6 disposed therein in a dispersed manner is prepared. As shown in FIG. 4(b), the shock waves P are generated by irradiating the base material 7 with the giant pulse laser light GL and causing the fine particles 6 to absorb the giant pulse laser light GL. The shock waves P are forced back inside the base material 7 so that the fine particles 6 and the base material 7 therearound are brought into an extremely high temperature and high compression state. Accordingly, the fine particles 6 undergo phase transition together with the base material 7, and a transparent chemical compound including at least any of the constituent elements of the base material 7 and the fine particles 6 is produced as a new synthetic substance 8 (refer to FIG. 5).

Scanning is performed with the giant pulse laser light GL used for irradiation in a surface region perpendicular to the incident direction thereof, and the phase transition of the fine particles 6 and the base material 7 progresses in the direction of scanning. As shown in FIG. 5(a), such scanning performed with the giant pulse laser light GL is repeated a plurality of times. Accordingly, phase transition of the fine particles 6 and the base material 7 occurs sequentially from the side where the giant pulse laser light GL is incident. As a result, as shown in FIG. 5(b), a predetermined region AR2 is reformed by causing the fine particles 6 and the base material 7 to undergo phase transition in the predetermined region AR2 throughout the entire base material 7, and the transparent synthetic substance 8 is produced in the predetermined region AR2.

Hence, in the method of producing a substance of the present embodiment as well, a new synthetic substance 8 can be produced easily. Particularly, in the present embodiment, the transparent synthetic substance 8 is produced by performing irradiation with the giant pulse laser light GL such that the fine particles 6 absorb the giant pulse laser light GL and thereby generating the shock waves P such that the fine particles 6 and the base material 7 undergo phase transition. In this manner, according to the present embodiment, a new transparent synthetic substance 8 can be produced by causing a plurality of fine particles 6 to undergo phase transition together with the base material 7 in the base material 7 into which the fine particles 6 are incorporated.

In the present embodiment, the transparent synthetic substance 8 is produced by performing scanning with the giant pulse laser light GL and thereby causing the fine particles 6 to undergo phase transition together with the base material 7 in the predetermined region AR2 in the base material 7. In this case, the synthetic substance 8 can be produced in the entire predetermined region AR2 by causing the entire predetermined region AR2 in the base material 7 to undergo phase transition.

A step of performing irradiation with the giant pulse laser light GL and causing the fine particles 6 to absorb the giant pulse laser light GL constitutes the producing step. In certain regions in the base material 7, the combination of materials for the base material 7 and the fine particles 6 may be suitably changed in accordance with the purpose.

Modification Example

Hereinabove, embodiments have been described, but the aspects of the present invention are not limited to the foregoing embodiments. In the aspects of the present invention, the combination of materials for a base material and a raw material is not particularly limited to those in the foregoing embodiments, and various combinations can be employed. Scanning is not limited to that in which the giant pulse laser light GL itself is moved and also includes that in which the giant pulse laser light GL relatively moves by moving a base material and a raw material. A state of being in contact with each other also includes that in which a defect or fine particles and a base material come into contact with each other.

REFERENCE SIGNS LIST

2 Jewel (base material)
4a, 7 Base material
3 Defect (raw material)
4 Laminate
4b Raw material
5 Substance (new substance)
6 Fine particle
8 Synthetic substance (a new substance)
AR1, AR2 Predetermined region
GL Giant pulse laser light
P Shock wave

The invention claimed is:

1. A method of producing a substance comprising:
a producing step of producing a new substance by, in a state in which a raw material absorbing giant pulse laser light is disposed inside a base material or in a state in which the base material and the raw material are brought into contact with each other and are clamped together, performing irradiation with the giant pulse laser light focused inside of the substance such that the raw material absorbs the giant pulse laser light and thereby generating shock waves such that at least the raw material undergoes phase transition.

2. The method of producing a substance according to claim 1,
wherein the base material is formed of a transparent material transparent with respect to the giant pulse laser light,
wherein the raw material is a defect disposed inside the transparent material, and
wherein in the producing step, the substance is produced by performing irradiation with the giant pulse laser light such that the defect absorbs the giant pulse laser light and thereby generating shock waves such that the defect undergoes phase transition and recrystallization and becomes a portion of the transparent material.

3. The method of producing a substance according to claim 1,
wherein the base material and the raw material have a thin film shape, and
wherein in the producing step, a laminate is formed by alternately laminating the base material and the raw material, the laminate is clamped in a lamination direction thereof, and a substance transparent with respect to the giant pulse laser light is produced by performing irradiation with the giant pulse laser light such that the raw material absorbs the giant pulse laser light and thereby generating shock waves such that the raw material and the base material undergo phase transition.

4. The method of producing a substance according to claim 3,
wherein in the producing step, the substance transparent with respect to the giant pulse laser light is produced by performing scanning with the giant pulse laser light and thereby causing the raw material and the base material in a predetermined region in the laminate to undergo phase transition.

5. The method of producing a substance according to claim 1,
wherein the raw material is fine particles disposed in a dispersed manner inside the base material, and
wherein in the producing step, a substance transparent with respect to the giant pulse laser light is produced by performing irradiation with the giant pulse laser light such that the fine particles absorb the giant pulse laser light and thereby generating shock waves such that the fine particles and the base material undergo phase transition.

6. The method of producing a substance according to claim 5,
wherein in the producing step, the substance transparent with respect to the giant pulse laser light is produced by performing scanning with the giant pulse laser light and thereby causing the fine particles and the base material to undergo phase transition in a predetermined region in the base material.

* * * * *